United States Patent
Pao

(10) Patent No.: US 11,264,780 B2
(45) Date of Patent: Mar. 1, 2022

(54) FLIP CHIP BACKSIDE EMITTING VCSEL PACKAGE

(71) Applicant: OEpic SEMICONDUCTORS, INC., Sunnyvale, CA (US)

(72) Inventor: Yi-Ching Pao, Sunnyvale, CA (US)

(73) Assignee: OEPIC SEMICONDUCTORS, INC., Sunnyvale, CA (US)

( * ) Notice: Subject to any disclaimer, the term of this patent is extended or adjusted under 35 U.S.C. 154(b) by 184 days.

(21) Appl. No.: 16/239,083

(22) Filed: Jan. 3, 2019

(65) Prior Publication Data

US 2019/0237931 A1  Aug. 1, 2019

Related U.S. Application Data

(60) Provisional application No. 62/622,668, filed on Jan. 26, 2018.

(51) Int. Cl.

| H01S 5/0234 | (2021.01) |
| H01S 5/042 | (2006.01) |
| H01S 5/42 | (2006.01) |
| H01S 5/323 | (2006.01) |
| H01S 5/024 | (2006.01) |
| H01S 5/183 | (2006.01) |
| H01S 5/0237 | (2021.01) |
| H01S 5/026 | (2006.01) |
| H01S 5/02345 | (2021.01) |

(52) U.S. Cl.
CPC ........ *H01S 5/04254* (2019.08); *H01S 5/0234* (2021.01); *H01S 5/0237* (2021.01); *H01S 5/02469* (2013.01); *H01S 5/18305* (2013.01); *H01S 5/18344* (2013.01); *H01S 5/323* (2013.01); *H01S 5/423* (2013.01); *H01S 5/026* (2013.01); *H01S 5/02345* (2021.01); *H01S 5/04257* (2019.08)

(58) Field of Classification Search
None
See application file for complete search history.

(56) References Cited

U.S. PATENT DOCUMENTS

| 6,633,421 | B2 * | 10/2003 | Trezza | H01S 5/0422 372/26 |
| 7,069,569 | B2 * | 6/2006 | Thornton | G11B 7/122 720/659 |
| 9,705,284 | B1 * | 7/2017 | Cheskis | H01S 5/04257 |
| 10,630,054 | B2 * | 4/2020 | Cao | H01S 5/1838 |
| 2006/0281309 | A1 * | 12/2006 | Trezza | H01L 24/24 438/675 |
| 2009/0175307 | A1 * | 7/2009 | Ryu | H01S 5/0262 372/50.21 |
| 2014/0218898 | A1 * | 8/2014 | Seurin | H01S 5/4018 362/157 |
| 2017/0033535 | A1 * | 2/2017 | Joseph | H01S 5/18308 |

\* cited by examiner

*Primary Examiner* — Tod T Van Roy
(74) *Attorney, Agent, or Firm* — Weiss & Moy, P.C.; Jeffrey D. Moy

(57) ABSTRACT

A flip chip backside Vertical Cavity Surface Emitting Laser (VCSEL) package has a VCSEL pillar array. A first metal contact is formed over a top section of each pillar of the VCSEL pillar array. A second metal contact is formed on a back surface of the VCEL pillar array. An opening is formed in the second metal contact and aligned with the pillars of the VCSEL pillar array. Solder tip is applied on each pillar of the VCSEL pillar array to flip chip mount the VCSEL pillar array.

13 Claims, 3 Drawing Sheets

FLIP CHIP BACKSIDE EMITTING VCSEL PACKAGE

RELATED APPLICATIONS

This patent application is related to U.S. Provisional Application No. 62/622,668 filed Jan. 26, 2018, entitled "FLIP CHIP PACKAGE OF BACKSIDE ILLUMINATING VCSEL FOR 3D SENSING ARRAY" in the name of Yi-Ching Pao, and which is incorporated herein by reference in its entirety. The present patent application claims the benefit under 35 U.S.C § 119(e).

TECHNICAL FIELD

The present invention generally relates to vertical cavity surface emitting lasers (VCSELs) and, more particularly to, a flip chip VCSEL which eliminates the need for bond wires and bond pads thereby reducing the footprint of the flip chip VCSEL device.

BACKGROUND

Semiconductor lasers are being used in many imaging applications which require high power illumination such as structured light sources for 3D imaging, Laser Detection and Ranging (LADAR), Time of Flight (TOF) 3D imaging, aviation defense, and fusion research, among others. Vertical Cavity Surface Emitting Lasers (VCSELs), are commonly used in many semiconductor laser applications due to the low power applications and high frequency superiority and manufacturing advantages over other type of semiconductor laser devices.

A VCSEL is a semiconductor micro-laser diode that emits light in a generally cylindrical beam. The beam is emitted vertically from the surface of the substrate on which it is fabricated. Because the beams in VCSELs emit vertically from the surface of the substrate, they can be tested on-wafer, before they are separated into individual devices. This reduces the fabrication cost of the devices. It also allows VCSELs to be built not only in one-dimensional, but also in two-dimensional arrays.

VCSELs generally have larger output apertures compared to most edge-emitting lasers. This may allow VCSELs to produce a lower divergence angle of the output beam, and makes possible high coupling efficiency with optical fibers. VCSELs also have high reflectivity mirrors, compared to most edge-emitting lasers, which may reduce the threshold current of VCSELs, resulting in low power consumption. The low threshold current also permits high intrinsic modulation bandwidths in VCSELs. The wavelength of VCSELs may also be tuned, within the gain band of the active region, by adjusting the thickness of the reflector layers.

In a VCSEL package assembly, the VCSEL device is frontside mounted to a substrate of the package by solder or epoxy. Wire bonding may then be used to attach the VCSEL device to external circuitry. The drawback of wire bonding of a front side emitting VCSEL is that wire bonding increases the footprint of the VCSEL package assembly. Also, since the active region (where the heat is being generated) is on the top side of the wafer, the heat source is farther away from the heatsink which is located at the back of the wafer. This will significantly raise the junction temperature of the VCSEL as the heat is not removed quickly from the front side of the wafer.

Therefore, it would be desirable to provide a device and method that overcome the above problems.

SUMMARY

In accordance with one embodiment, a flip chip backside Vertical Cavity Surface Emitting Laser (VCSEL) package is disclosed. The flip chip backside VCSEL package has a VCSEL pillar array. A first metal contact is formed over a top section of each pillar of the VCSEL pillar array. A second metal contact is formed on a back surface of the VCEL pillar array. An opening is formed in the second metal contact and aligned with the pillars of the VCSEL pillar array. Solder tip is applied on each pillar of the VCSEL pillar array to flip chip mount the VCSEL pillar array.

In accordance with one embodiment, a flip chip backside Vertical Cavity Surface Emitting Laser (VCSEL) package is disclosed. The flip chip backside Vertical Cavity Surface Emitting Laser (VCSEL) package has a VCSEL pillar array. A first metal contact is formed over a top section of each pillar of the VCSEL pillar array. A second metal contact is formed on aback surface of the VCEL pillar array. An opening is formed in the second metal contact and aligned with the pillars of the VCSEL pillar array. A substrate package having a plurality of substrate package metal contacts is provided. The VCSEL pillar array is flip chip mounted to the substrate package forming a backside illuminating VCSEL array, wherein the first metal contact formed over a top section of each pillar of the VCSEL pillar array is coupled to one of the plurality of substrate package metal contacts. Solder is applied on each pillar of the VCSEL pillar array to flip chip mount the VCSEL pillar array to the substrate package.

In accordance with one embodiment, a method of forming method of forming a flip chip backside Vertical Cavity Surface Emitting Laser (VCSEL) package is disclosed. The method comprises: forming a VCSEL pillar array; applying a first metal contact over a top section of each pillar of the VCSEL pillar array; applying a second metal contact formed on a back surface of the VCEL pillar array, wherein an opening is formed in the second metal contact and aligned with the pillars of the VCSEL pillar array, and applying solder on each pillar of the VCSEL pillar array to flip chip mount the VCSEL pillar array to the substrate package, wherein the substrate package has a plurality of substrate package metal contacts, the VCSEL pillar array flip chip mounted to the substrate package forming a backside illuminating VCSEL array, wherein the first metal contact formed over a top section of each pillar of the VCSEL pillar array is coupled to one of the plurality of substrate package metal contacts.

BRIEF DESCRIPTION OF THE DRAWINGS

The present application is further detailed with respect to the following drawings. These figures are not intended to limit the scope of the present application but rather illustrate certain attributes thereof. The same reference numbers will be used throughout the drawings to refer to the same or like parts.

DESCRIPTION OF THE APPLICATION

The description set forth below in connection with the appended drawings is intended as a description of presently preferred embodiments of the disclosure and is not intended to represent the only forms in which the present disclosure may be constructed and/or utilized. The description sets forth the functions and the sequence of steps for constructing and operating the disclosure in connection with the illustrated embodiments. It is to be understood, however, that the same or equivalent functions and sequences may be accomplished by different embodiments that are also intended to be encompassed within the spirit and scope of this disclosure.

Embodiments of the exemplary VCSEL package and method of forming the same disclose a backside illuminating VCSEL configured with flip-chip arrangement. The VCSEL package and method use via holes or wrap around connections to reach the back-side N+ substrate and/or metal contacts without the need of any bond wires in the assembly and packaging process reducing the footprint of the VCSEL package by eliminating the bond wires and extended bond pads outside the chip area. Complete assembly to attach the VCSEL chip and make all needed electrical connections to the package substrate is done by a simple solder reflow process with solder tip at the VCSEL pillar or mesa tops and also the backside via hole or wrap around contact metal pad areas. This feature eliminates the need of a typical two-step process of die attach first and wire bonding the next, which simplifies the assembly and packaging process into one re-flow process. Thus, the above arrangement simplifies the assembly process, reduces the form factors and footprint of the VCSEL packages and increases the yield of the packaged VCSEL die.

Figure 1:
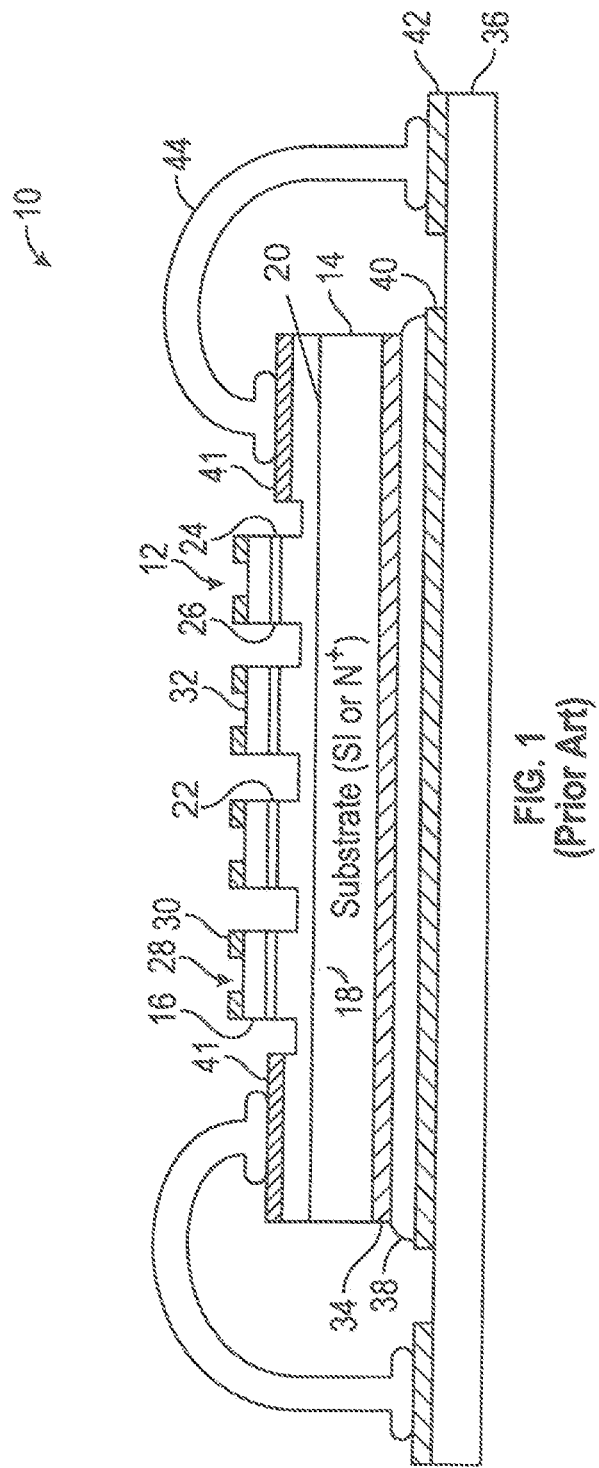
FIG. 1 show cross-sectional view of prior art VCSEL package.

Referring to FIG. 1, a prior art VCSEL package 10 may be seen. The VCSEL package 10 may be formed of a VCSEL array 12. The VCSEL array 12 is formed on a substrate 14. The substrate 14 may be gallium arsenide (GaAs) substrate 14 or similar material. A pair of Distributed Braggs Reflectors (DBR) 16 and 18 may be formed on the substrate 14 and runs parallel to the substrate 14. The DBRs 16 and 18 may be formed of a plurality of layers. The DBRs 16 and 18 may be formed by disposing multiple layers of alternating materials with varying optical impedances. In general, the multiple alternate between high and low optical impedances.

An active region 20 may be formed between the pair of DBRs 16 and 18. The active region 20 may be formed of one or more quantum wells for laser light generation. A buried layer 22 may be formed between the active region 20 and the DBR 18. The buried region 22 may be selectively oxidized to form oxide apertures 24 and 26.

One or more pillars 28 may then be formed by etching through the DBR 18 down to the active region 20 and to the DBR 16. Reactive ion etching may be used to form the free-standing pillars 28. A top metal contact ring 30 may then be formed on the top of the pillar 28. The metal contact ring 30 will need to have a center open 32 to emit light therethrough. A bottom metal contact layer 34 may be formed on the substrate 14.

To bond the VCSEL array 12 to a package device 36, a solder or conductive epoxy 38 (hereinafter solder 38) may be applied to electrically couple the contact 40 of the package device 36 to the bottom metal contact layer 34 of the VCSEL array 12. Electrical connections between the VCSEL array 12 and the package device 36 may be formed through wire bonding. In wire bonding, contacts 41 on the VCSEL array may be electrically coupled to bond pads 42 on the package device 36 though bond wires 44. However, the bond wire arrangement requires the bond pads 42 to extend outside the footprint of the VCSEL array 12. The bond wire arrangement may extend the footprint of the whole assembly by 2× the actual size of the VCSEL array 12 in any given dimension. Thus, in a two-dimensional (X and Y) arrangement this means the footprint of the VCSEL package 10 may be as large as 4× of the actual VCSEL array 12. This large footprint required by the prior art is a major concern in any space limited handheld applications such as handset and any mobile device.

Figure 2:
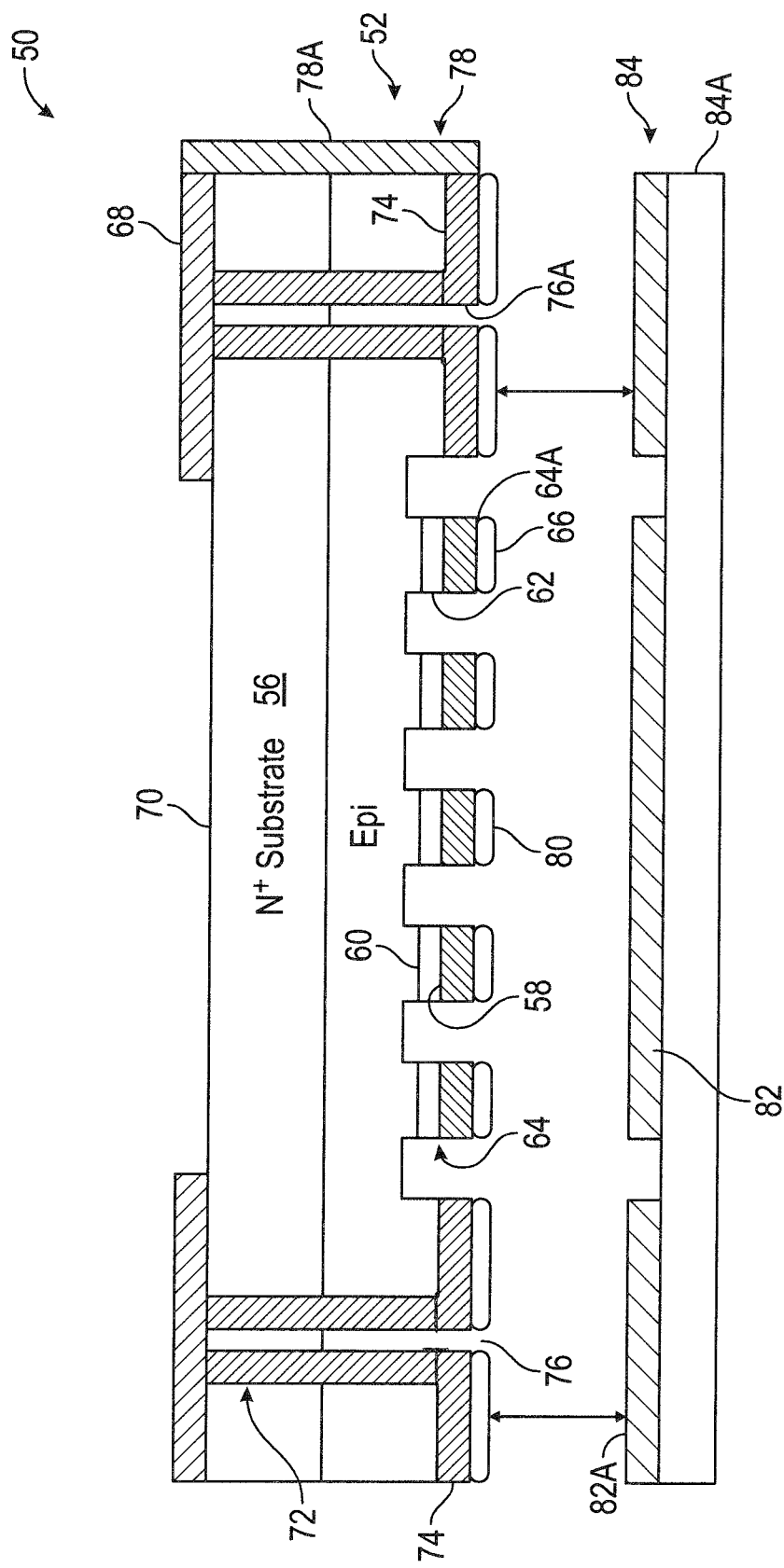
FIG. 2 shows a cross-sectional view of an exemplary embodiment of a flip chip backside emitting VCSEL package in accordance with one aspect of the present application.
Figure 3:
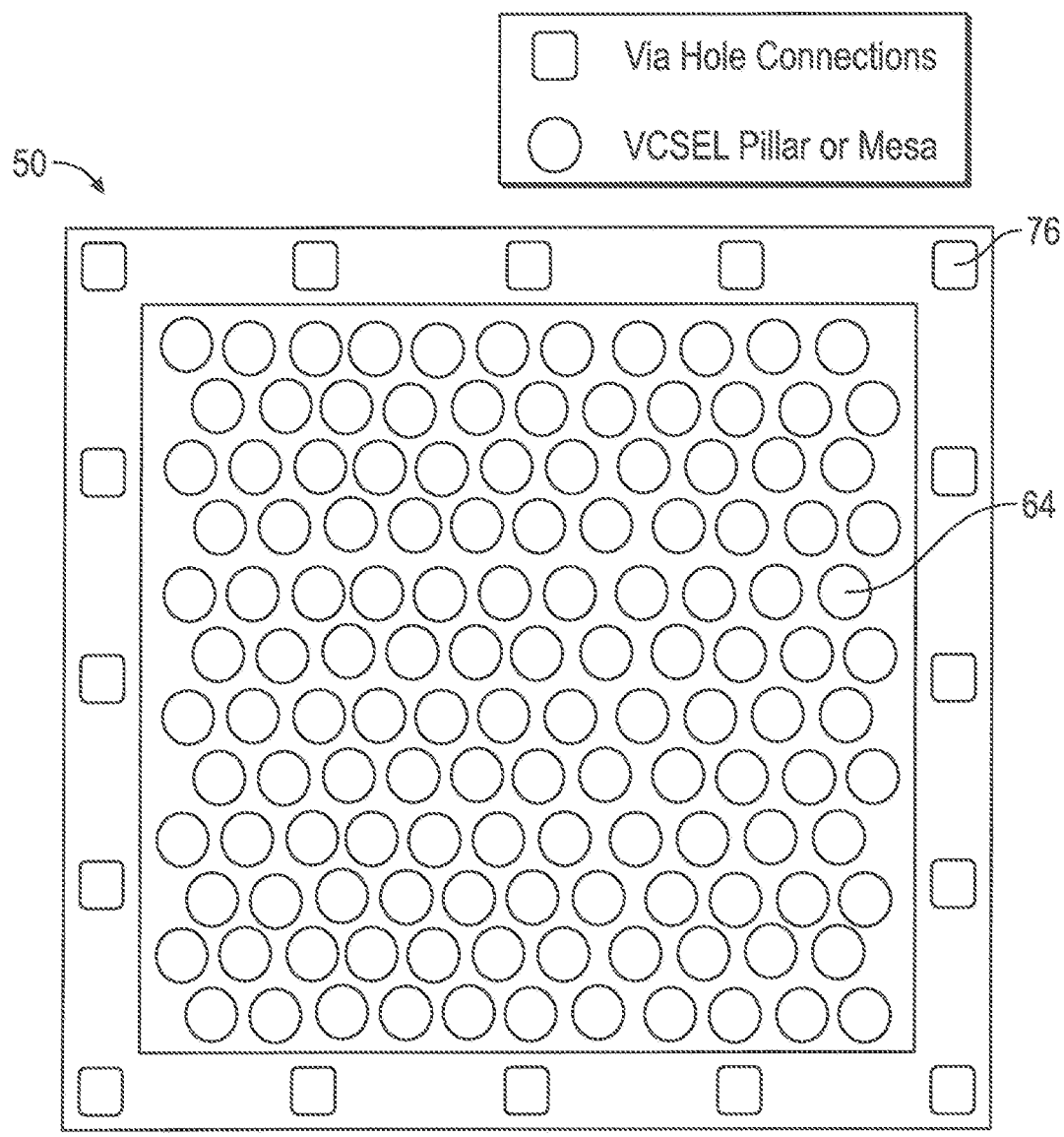
FIG. 3 is a top view of a top view of an exemplary embodiment of a flip chip backside illuminating VCSEL package in accordance with one aspect of the present application.

Referring to FIGS. 2 and 3, an exemplary embodiment of a flip chip backside emitting VCSEL package 50 may be seen. The VCSEL package 50 has multiple advantages over the prior art designs namely: (1) flip-chip configuration with one step reflow assembly process; (2) via or wrap around connection to the N+ substrate or backside contact of the VCSEL array; (3) reduced footprint due to the elimination of bond wires and bond pads and (4) backside emitting VCSEL package with options of aperture lens and other optical arrangements on the backside of the wafer. In accordance with one embodiment, the wavelength of the current invention of VCSEL package 50 is 940 nm for 3D sensing applications or 980 nm for power applications such as fiber pump lasers.

The VCSEL package 50 may have a backside emitting VCSEL array 52 (hereinafter VCSEL array 52). The VCSEL array 52 may be formed in a manner described in co-pending patent application entitled "PILLAR CONFINED BACKSIDE ILLUMINATING VCSEL" in the name of Yi-Ching Pao, Majid Riaziat, Ta-Chung Wu, Wilson Kyi and James Pao and which is incorporated herein by reference in its entirety.

The VCSEL array 52 is formed on a substrate 56. The substrate 56 may be gallium arsenide (GaAs) substrate 56 or similar material. In accordance with one embodiment, the substrate 56 may be an N+ substrate.

A pair of Distributed Braggs Reflectors (DBR) 58 and 60 may be formed on the substrate 56 and runs parallel to the substrate 56. The DBRs 58 and 60 may be formed of a plurality of layers. The DBRs 58 and 60 may be formed by disposing multiple layers of alternating materials with varying optical impedances. In general, the multiple alternate between high and low optical impedances. An active region 62 may be formed between the pair of DBRs 58 and 60. The active region 62 may be formed of one or more quantum wells for laser light generation.

A plurality of pillars 64 may then be formed. In the present embodiment, a highly directional ICP (Inductive Coupled Plasma) reactive ion etcher (RIE) may be used to etch highly anisotropic pillars 64. By using ICP-RIE, the pillars 64 may have a cylinder type of cross-sectional profile having close to straight side walls. In accordance with one embodiment, the pillars 64 may have a profile in the 5-50 um diameter range. Etching by using ICP-RIE is important since if wet chemical isotropic etchant is used, the side walls of the pillars 64 will be tapered which will present issues when small diameter VCSELs are to be fabricated. Thus, the pillars 64 should be etched by ICP-RIE with an anisotropic straight wall profile.

A metal contact 66 may then be deposited and cover the top of each of the pillars 64. The metal contact 66 does not have to be in a ring configuration to emit laser light therethrough. In accordance with one embodiment, the metal contact 66 may be use as the pillar ICP-RIE etch mask so there will be no need to deposit the top metal contact after the ICP-RIE pillar etch is performed.

After the metal contact 66 is formed, the wafer upon which the VCSEL array 54 is formed upon may be turned around to form a metal contact 68. The metal contact 68 may be formed with an opening 70 to allow the laser light to be emitted from the back of the VCSEL array 54. The opening 70 may be aligned with the pillars 64 to allow the laser light to be emitted from the back of the VCSEL array 52.

Electrical connections 72 may be formed between the metal contact 68 and a backside of the substrate 56. Alternatively, or in addition to, the electrical connections 72 may be formed between the metal contact 68 and metal contacts 74 formed on the backside of the substrate 56 and around an outer perimeter of the pillars 64. The electrical connections 72 may be one or more vias 76 formed on around an outer perimeter of the VCSEL array 54, wrap around connections 78, or the like. If vias 76 are used, the vias 76 may have a metal coating 76A to form an electrical connection. The wrap around connection 78 may use a metal connector 78A which is applied to and conforms to the side of the VCSEL array 54. The electrical connections 72 eliminates the use of any bond wires and bond pads thereby reducing the footprint due of the VCSEL package 50. The footprint due of the VCSEL package 50 may now be approximately the same as the VCSEL array 54.

To flip-chip mount the VCSEL array 54 with a one-step re-flow assembly process, solder tips 80 may be applied to the metal contacts 66 on every pillar 64 and to a bottom surface of the metal contacts 74. It is important that the solder tips 80 are plated and formed on the top of each pillar 64 to ensure good thermal contact of each and every pillar 64 within the VCSEL array 52, and to avoid any air voids formed underneath, which may cause uneven thermal contact and create localized heated spots.

In accordance with one embodiment, the solder tips 80 may be done by electric-chemical plating a thin layer of solder 80 such as Au—Sn on top of the metal contact 66 of each pillar 64 and the metal contacts 74. The wafer upon which the VCSEL array 54 is formed upon may be turned upside down so that the solder tips 80 meets and join metal contacts 82 of a package 84. The package 84 may have a heat sinking substrate 84A to extract the heat generated by the VCSEL array 52 when high power applications are intended. The heat sinking substrate 84A can be either ceramic or PCB (FR4 or FR5 as examples) based where metal pads and electrical connections are formed by photolithography, plating, and/or chemical etching processes. In accordance with one embodiment, the solder tips 80 meets and joins the metal contacts 82 through a furnace re-flow process.

In order to flip-chip mount the VCSEL array 54 with a one-step re-flow assembly process the top surface 64A of the pillars 64 need to be mechanically flat and at approximately the same height level. Similarly, the top surface 82A of the metal contacts 82 need to be mechanically flat and at approximately the same height level. Thus, it may be necessary to have the same metal deposit, specifically a P-type ohmic contact metal for the pillars 64, to not only cover the top of the pillar 64 but also the entire wafer area including the backside contact area where the vias 76 may be placed.

The VCSEL package 50 may use a backside illuminating VCSEL array 54 configured in a flip-chip arrangement and may use electrical connections 72 such as vias 76 or wrap around connections 78 to reach the back side of the substrate 56 and/or metal contacts 74 without the need of any bond wires in the assembly and packaging process. Complete assembly to attach the VCSEL array 54 and make needed electrical connections to the package substrate 84 may be done by a simple solder reflow process with solder tips 80 at the top of each pillar 64 and the metal contacts 74. This feature eliminates the need of a typical two-step process of die attach first and wire bonding the next, which simplifies the assembly and packaging process into one re-flow process. Further, the elimination of the bond pads and bond wires drastically reduces the footprint of the package size. This increases the yield of the packaged VCSEL array and at the same time reduce the form factors and footprint of the VCSEL packages dramatically.

While embodiments of the disclosure have been described in terms of various specific embodiments, those skilled in the art will recognize that the embodiments of the disclosure may be practiced with modifications within the spirit and scope of the claims.

What is claimed is:

1. A flip chip backside Vertical Cavity Surface Emitting Laser (VCSEL) package comprising:
   a substrate;
   a VCSEL pillar array formed on the substrate;
   a first metal contact formed over a top section of each pillar of the VCSEL pillar array;
   a second metal contact formed on a back surface of the substrate;
   an opening formed in the second metal contact and aligned with the pillars of the VCSEL pillar array;
   a plurality of third metal contacts formed around a perimeter of the VCSEL pillar array;
   a plurality of plated vias formed around a perimeter of the VCSEL pillar array and through the substrate forming the VCSEL pillar array, the plurality of plated vias electrically connecting the second metal contact to the third metal contact; and
   solder tip applied on each pillar of the VCSEL pillar array to flip chip mount the VCSEL pillar array.

2. The flip chip backside VCSEL package of claim 1, comprising a plurality of wrap around connections formed around a perimeter of the VCSEL pillar array, wherein each of the wrap around connections is applied to a side surface of the VCSEL pillar array and electrically connects the second metal contact to one of the plurality of third metal contacts.

3. The flip chip backside VCSEL package of claim 1, wherein at least one of the third metal contacts is electrically coupled to the second metal contact through one of the plurality of vias, wherein the third metal contacts are of a same height as each of the first contacts.

4. The flip chip backside VCSEL package of claim 1, comprising a substrate package having a plurality of substrate package metal contacts, the VCSEL pillar array flip chip mounted to the substrate package so the first metal contact formed over a top section of each pillar of the VCSEL pillar array is coupled to one of the plurality of substrate package metal contacts.

5. The flip chip backside VCSEL package of claim 4, wherein the substrate package is of a same length of the VCSEL array.

6. The flip chip backside VCSEL package of claim 4, wherein the substrate package is a heat sink.

7. A flip chip backside Vertical Cavity Surface Emitting Laser (VCSEL) package comprising:
   a substrate a VCSEL pillar array formed on the substrate;

a first metal contact formed over a top section of each pillar of the VCSEL pillar array;

a second metal contact formed on a back surface of the VCSEL pillar array;

an opening formed in the second metal contact and aligned with the pillars of the VCSEL pillar array;

a plurality of third metal contacts formed around a perimeter of the VCSEL pillar array;

a plurality of plated vias formed around a perimeter of the VCSEL pillar array and through the substrate electrically connecting at least one of the second metal contact to the third metal contact;

a substrate package having a plurality of substrate package metal contacts, the VCSEL pillar array flip chip mounted to the substrate package forming a backside illuminating VCSEL array, wherein the first metal contact formed over a top section of each pillar of the VCSEL pillar array is coupled to one of the plurality of substrate package metal contacts; and solder applied on each pillar of the VCSEL pillar array to flip chip mount the VCSEL pillar array to the substrate package.

8. The flip chip backside VCSEL package of claim 7, comprising a plurality of wrap around connections formed around a perimeter of the VCSEL pillar array, the plurality of wrap around connections applied to side surfaces of the VCSEL pillar array and electrically connecting the second metal contact to one of the plurality of third metal contacts.

9. The flip chip backside VCSEL package of claim 7, wherein the plurality of third metal contacts are of a same height as each of the first contacts.

10. The flip chip backside VCSEL package of claim 7, wherein the substrate package is of a same length of the VCSEL array.

11. A method of forming a flip chip backside Vertical Cavity Surface Emitting Laser (VCSEL) package comprising:

forming a VCSEL pillar array on a substrate;

applying a first metal contact over a top section of each pillar of the VCSEL pillar array;

applying a second metal contact formed on a back surface of the substrate, wherein an opening is formed in the second metal contact and aligned with the pillars of the VCSEL pillar array;

applying a plurality of third metal contacts around a perimeter of the VCSEL pillar array;

forming a plurality of plated vias around a perimeter of the VCSEL pillar array and through the substrate electrically connecting at least one of the second metal contact to one of the plurality of third metal contacts; and applying solder on each pillar of the VCSEL pillar array to flip chip mount the VCSEL pillar array to a substrate package, wherein the substrate package has a plurality of substrate package metal contacts, the VCSEL pillar array flip chip mounted to the substrate package forming a backside illuminating VCSEL array, wherein the first metal contact formed over a top section of each pillar of the VCSEL pillar array is coupled to one of the plurality of substrate package metal contacts.

12. The method of claim 11, comprising forming a plurality of wrap around connections around a perimeter of the VCSEL pillar array, the plurality of wrap around connections applied to side surfaces of the VCSEL pillar array and electrically connecting the second metal contact to the third metal contact.

13. The method of claim 11, wherein the third metal contacts are of a same height as each of the first contacts.

* * * * *